United States Patent
Old et al.

(10) Patent No.: US 10,659,083 B1
(45) Date of Patent: May 19, 2020

(54) SORT SYSTEM INCLUDING NORMALIZATION

(71) Applicant: Xilinx, Inc., San Jose, CA (US)

(72) Inventors: Gordon I. Old, Edinburgh (GB); Justin A. Fritz, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 56 days.

(21) Appl. No.: 16/150,142

(22) Filed: Oct. 2, 2018

(51) Int. Cl.
*H03M 13/37* (2006.01)
*H03M 13/13* (2006.01)
*H03M 13/45* (2006.01)

(52) U.S. Cl.
CPC ....... *H03M 13/3746* (2013.01); *H03M 13/13* (2013.01); *H03M 13/45* (2013.01)

(58) Field of Classification Search
CPC ... H03M 13/3746; H03M 13/13; H03M 13/45
See application file for complete search history.

(56) References Cited

U.S. PATENT DOCUMENTS

2018/0323810 A1* 11/2018 Sarkis ............... H03M 13/3738

FOREIGN PATENT DOCUMENTS

WO    WO-2017178056 A1 * 10/2017 ............ H03M 13/13

OTHER PUBLICATIONS

Balatsoukas-Stimming, "Hardware Architecture for List Successive Cancellation Decoding of Polar Codes", Aug. 2014, IEEE, IEEE Transactions on Circuits and Systems—II: Express Briefs, vol. 61, No. 8 (Year: 2014).*
Balatsoukas-Stimming, "On Metric Sorting for Successive Cancellation List Decoding of Polar Codes", May 2015, IEEE, 2015 IEEE International Symposium on Circuits and Systems (ISCAS) (Year: 2015).*
Lin, "An Efficient List Decoder Architecture for Polar Codes", Nov. 2015, IEEE, IEEE Transactions on Very Large Scale Integration (VLSI) Systems, vol. 23, No. 11 (Year: 2015).*
Sarkis, "Fast List Decoders for Polar Codes", Feb. 2016, IEEE, IEEE Journal on Selected Areas in Communications, vol. 34, No. 2 (Year: 2016).*
Li, "Enhanced Metric Sorting for Successive Cancellation List Decoding of Polar Codes", Apr. 2018, IEEE, IEEE Communications Letters, vol. 22, No. 4 (Year: 2018).*
Balatsoukas-Stimming, parizi, Burg, "LLR-Based, Successive Cancellation List Decoding of Polar Codes", IEEE Transactions on Signal Processing, Sep. 2014.

* cited by examiner

*Primary Examiner* — Cynthia Britt
*Assistant Examiner* — Matthew W Wahlin
(74) *Attorney, Agent, or Firm* — W. Eric Webostad

(57) ABSTRACT

Apparatuses and methods generally relating to a sort system, such as may be used in a data processing kernel, for list decoding of a Polar codeword are described. In one such sort system, a sorter circuit is configured to receive and sort path metrics for coded bits of the Polar codeword. The path metrics are obtained from log-likelihood ratios associated with the coded bits. A limiter circuit is configured to cull the sorted path metrics to provide a list having a subset of the path metrics to limit output paths of a list decoder. A normalizer circuit is configured to subtract a path metric of the path metrics or a threshold metric representing a minimum metric respectively from entries in the list to provide normalized path metrics to decode the Polar codeword.

20 Claims, 10 Drawing Sheets

US 10,659,083 B1

SORT SYSTEM INCLUDING NORMALIZATION

FIELD OF THE INVENTION

The following description relates to integrated circuit devices ("ICs"). More particularly, the following description relates to a sort system including normalization for an IC.

BACKGROUND

In Polar code decoding, soft values, usually expressed as log-likelihood ratios, represent bits being decoded. Each bit of a codeword is decoded in turn using Successive Cancelation ("SC") from beginning to end of a codeword in Polar decoding, namely a "Polar codeword". If a single bit is incorrectly decoded, a conventional SC Polar code decoder may not revisit such bit to correct such an error. Along those lines, Successive Cancelation List ("SCL") Polar code decoding may be used to address this limitation of SC Polar code decoding. SCL decoding looks at multiple possibilities, such as for example 2^N possibilities, for N a bit length of a codeword to be decoded in order to reduce the likelihood of a decoding error. However, 2^N possibilities for decoding may be too large for many applications.

In a conventional implementation, a list size is limited so as to reduce the amount of resources used to store and operate on an operating list for SCL decoding. As a result of having an operating list which is smaller than a corresponding search space, a choice is made during processing. Along those lines, possible codewords may be referred to as paths, because during decoding of codewords in-process bits thereof describe paths through a decision tree, where each decision is either a logic 1 or a logic 0. To facilitate each decision, each path is associated with a path metric which is a measure of a likelihood that such a path is correct based upon values of log-likelihood ratios ("LLRs") output by a decoder.

During decoding, the number of paths may double in SCL decoding each time an information bit is encountered, as for each current path two output paths may be created. One of each such two created paths, namely a first created "child" or output path, has a logic 0 appended to a corresponding "parent" or input path, and another of each such two created paths, namely a second created "child" or output path, has a logic 1 appended to such a corresponding "parent" or input path. Each child path has a corresponding path metric determined for it. A list of path metrics corresponding to child paths is sorted, and such list may be culled to at most L child paths for having a corresponding L path metrics representing the "best" or most likely candidates, where L is a list size limit in such conventional implementation.

SUMMARY

An apparatus relates generally to a sort system for list decoding of a Polar codeword. In one such sort system, a sorter circuit is configured to receive and sort path metrics for coded bits of the Polar codeword. The path metrics are obtained from log-likelihood ratios associated with the coded bits. A limiter circuit is configured to cull the sorted path metrics to provide a list having a subset of the path metrics to limit output paths of a list decoder. A normalizer circuit is configured to subtract a path metric of the path metrics or a threshold metric representing a minimum metric respectively from entries in the list to provide normalized path metrics to decode the Polar codeword.

An apparatus relates generally to a data processing kernel for list decoding of a Polar codeword. In one such data processing kernel, a datapath pipeline has a sort system and has upstream datapath functions and downstream datapath functions of a list decoder with respect to the sort system. The sort system includes: a sorter circuit configured to receive and sort path metrics for coded bits of the Polar codeword, the path metrics obtained from log-likelihood ratios associated with the coded bits; a limiter circuit configured to cull the sorted path metrics to provide a list having a subset of the path metrics to limit output paths of the list decoder; and a normalizer circuit configured to subtract a path metric of the path metrics or a threshold metric representing a minimum metric respectively from entries in the list to provide normalized path metrics to decode the Polar codeword.

A method relates generally to processing data for list decoding of a Polar codeword. In such a method, path metrics are obtained by a sorter circuit for coded bits of the Polar codeword. The path metrics are obtained from log-likelihood ratios associated with the coded bits. The sorter circuit sorts the path metrics. A limiter circuit culls the sorted path metrics to provide a list having a subset of the path metrics to limit output paths in a list decoder. A normalizer circuit subtracts a path metric of the path metrics or a threshold metric from entries in the list to provide normalized path metrics. Differences are output from the subtracting as the normalized path metrics to decode the Polar codeword.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 1-2 is a block diagram depicting an exemplary data processing kernel for a list decoder.

FIG. 1-3 is a block diagram depicting an exemplary data processing kernel for a Successive Cancelation List ("SCL") decoder.

FIG. 2-1 is a block diagram depicting an exemplary sort system.

FIG. 2-2 is a block diagram depicting an exemplary path metrics sort system.

FIG. 3-1 is a circuit diagram depicting an exemplary normalizer circuit.

FIG. 3-2 is a circuit diagram depicting another exemplary normalizer circuit.

FIGS. 4-1 through 4-3 are respective circuit diagrams depicting yet other exemplary normalizer circuits.

FIG. 5-1 is a flow diagram depicting an exemplary decoding process for processing data.

FIG. 5-2 is a flow diagram depicting another exemplary decoding process for processing data.

DETAILED DESCRIPTION

Figure 1:
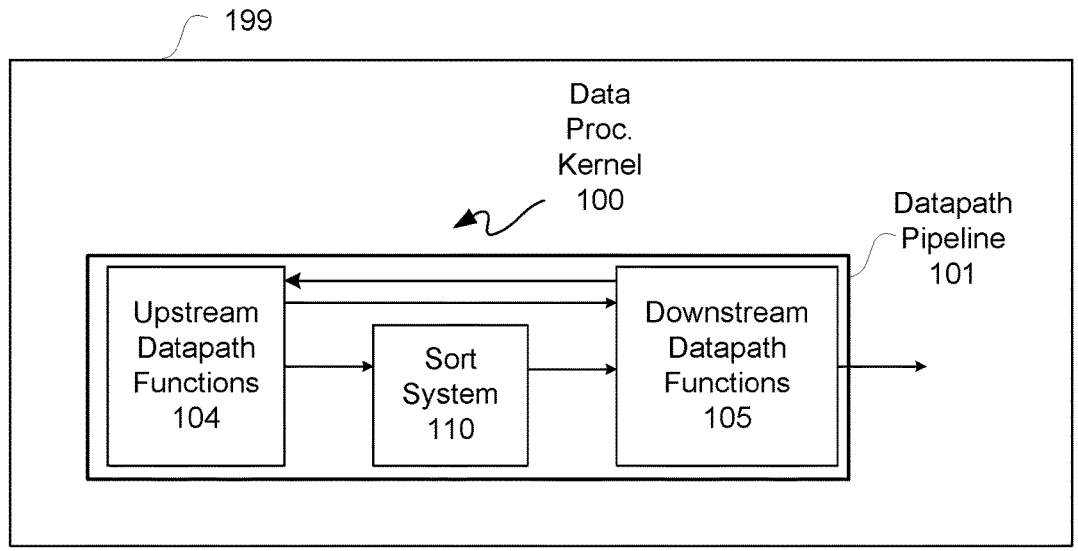
FIG. 1-1 is a block diagram depicting an exemplary data processing kernel of a list decoder.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

In Successive Cancellation List ("SCL") decoding for Polar codes, a list of candidate codewords or "paths" is maintained as decoding proceeds. Each of these paths is associated with path metric values ("path metrics"). Path metrics, which in SCL decoding are always positive numbers, may be sorted from highest to lowest confidence values, which means from smallest path metrics to largest path metrics. In other words, small path metrics are favored over large path metrics for correct outcomes in list decoding.

SCL decoding may look at multiple possibilities, such as for example $2^N$ possibilities, for N a bit length of a codeword to be decoded in order to reduce the likelihood of a decoding error. However, depending on the value of N, $2^N$ possibilities may be too large for many applications. Along those lines, the number of possibilities maintained during decoding may be $2^L$, where L is less than N and so $2^L$ is much less than $2^N$. In SCL decoding, path metrics are updated prior to a sort and cull sequence. After a sort of path metrics, path metrics with the lowest confidence values may be culled, namely paths or candidate codewords may be discarded as list decoding proceeds.

Path metrics in list decoding are an accumulation of absolute values of log-likelihood-ratios ("LLRs") for some of the bits decoded for a codeword. Because of this accumulation, path metrics exhibit bit growth from an LLR bit width of up to $\log_2(N)$ bits, again where N is the number of bits in a codeword. This gives a maximum possible value for a path metric, namely "PMmax," of $2^{(\log_2(LLRWidth)+\log_2(N))}-1$, for an unsigned number.

A sorter, in accordance with the description herein, may be used for a sorter system. Sort size is directly related to path metric bit width ("path metric width"), and so reducing path metric width can save considerable circuit resources, as a sort circuit is a large circuit.

However, if a value less than a maximum possible path metric value, namely a value less than PMmax, is used, there is a potential hazard that all valid paths may saturate, after which a decoding error is likely as a decoder cannot thereafter differentiate between path metrics if all are saturated. Because paths with high path metrics are eliminated in a post-sort cull, a maximum path metric in many applications is considerably less than PMmax. Along those lines, a maximum path metric width is selected, though less than required to describe PMmax.

The smaller such maximum path metric width value is, the smaller the circuit resource usage by a sorter circuit is. If, however, too small a maximum path metric width is selected, then saturation may occur, namely where a highest confidence, or lowest path, metric reaches such maximum path metric width selected, then a list decoder can no longer make correct decisions about relative values of paths and decoding failure becomes very likely.

To mitigate risk of saturation while still using a small maximum path metric width, namely substantially smaller than width of PMmax, growth of dynamic range of paths is systematically constrained in a downward direction, namely toward a path metric value of zero. This constraining may be by a reduction of such dynamic range, such as may be implemented by subtracting a minimum path metric of path metrics from each existing path after an update of path metrics. A subtract is used rather than a shift, as truncation or rounding may be implied by a shift operation. A shift therefore actually has potential to change relative values of path metrics and hence negatively affect decoding. In contrast, a subtraction leaves path metrics relative values "untouched," so there is no negative side-effect on decoding performance as there may be with a shift operation.

With the above general understanding borne in mind, various configurations for processing data are generally described below.

FIG. 1-1 is a block diagram depicting an exemplary data processing kernel 100 of a list decoder 199. Data processing kernel 100 may include a datapath pipeline 101. A datapath pipeline 101 may have a sort system 110, as well as upstream datapath functions 104 and downstream datapath functions 105 with respect to such sort system 110.

Figures 1, 2:
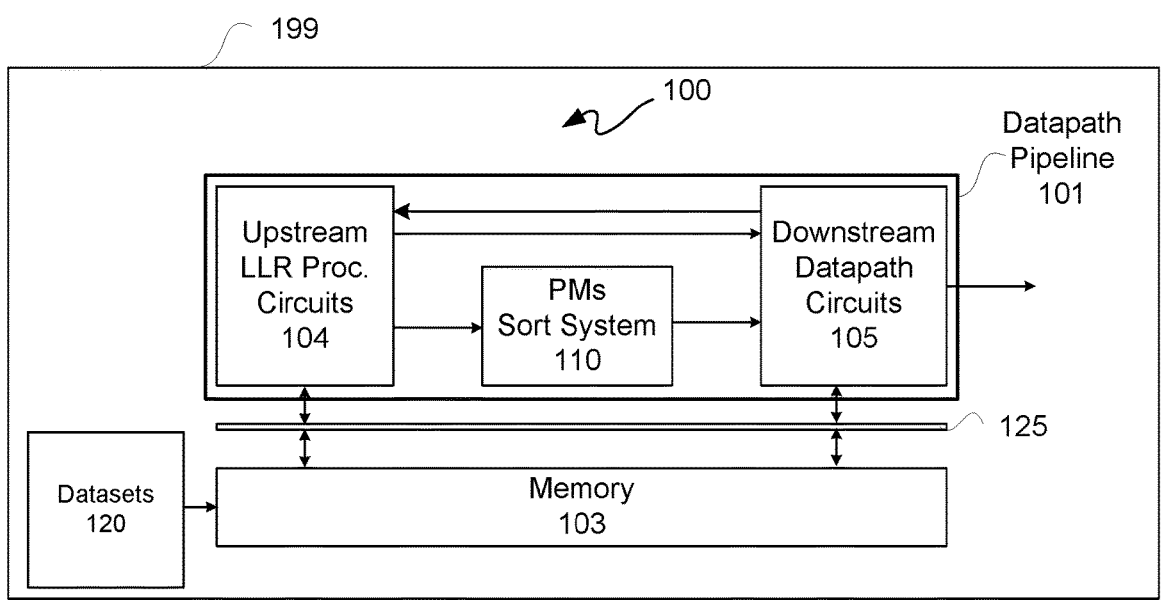

FIG. 1-2 is a block diagram depicting an exemplary data processing kernel 100 for an implementation of a list decoder, such as a list decoder 199. Data processing kernel 100 as a decoder may include in part a datapath pipeline 101. A datapath pipeline 101 may have a path metrics ("PMs") sort system 110. In this example, upstream datapath functions 104 and downstream datapath functions 105 may include corresponding upstream log-likelihood-ratio ("LLR") processing circuits 104 and/or downstream log-likelihood-ratio processing circuits 105. While LLR processing could occur before and after a sort, LLR processing generally is performed only once per pass around a decoding loop. Along those lines, LLR processing may be performed either before or after a sort. In this example, upstream datapath functions 104 are upstream LLR processing circuits, and downstream datapath functions 105 are downstream datapath circuits 105, which do not perform LLR calculations.

In this example, datasets 120, which may be codewords to be decoded, are provided to memory 103. Memory 103 may be in communication with upstream LLR processing circuits 104 and downstream LLR processing circuits 105 via a memory interface bus 125.

Figures 1, 2, 3:
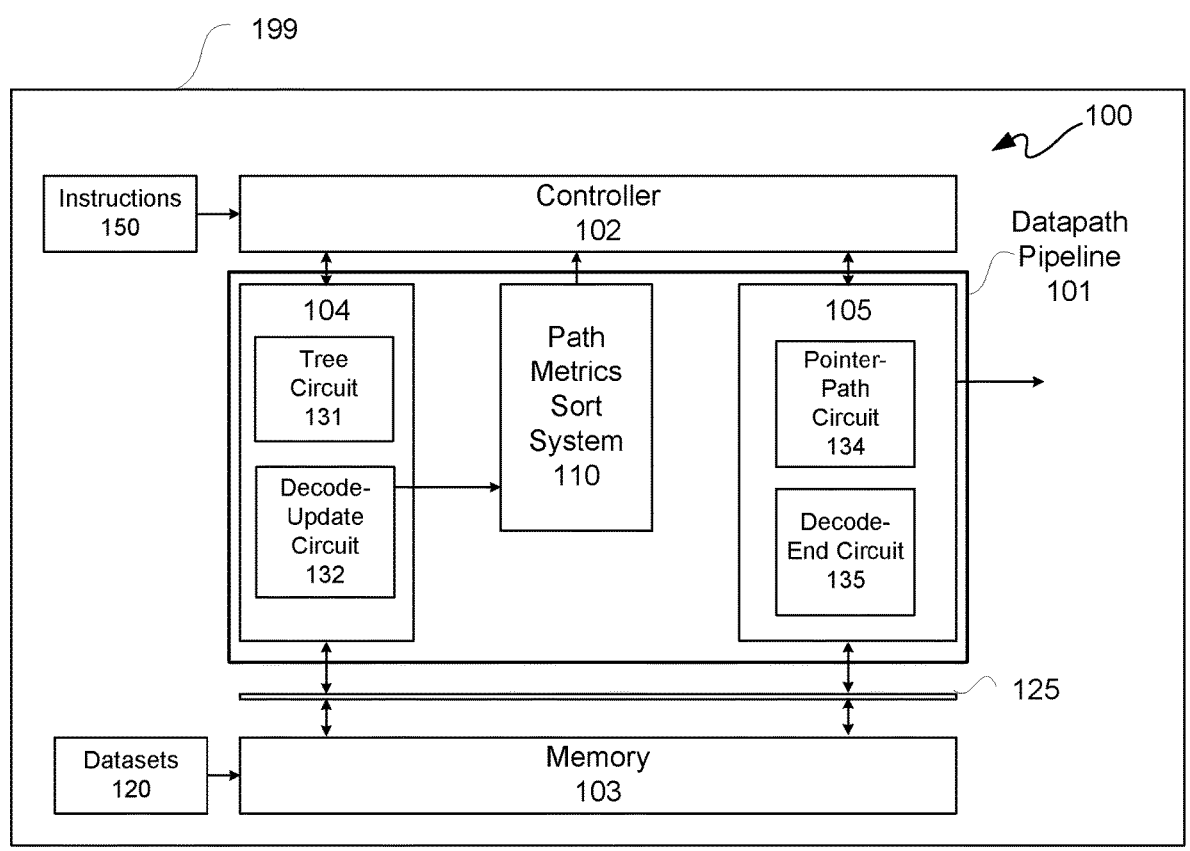
Figures 1, 2:
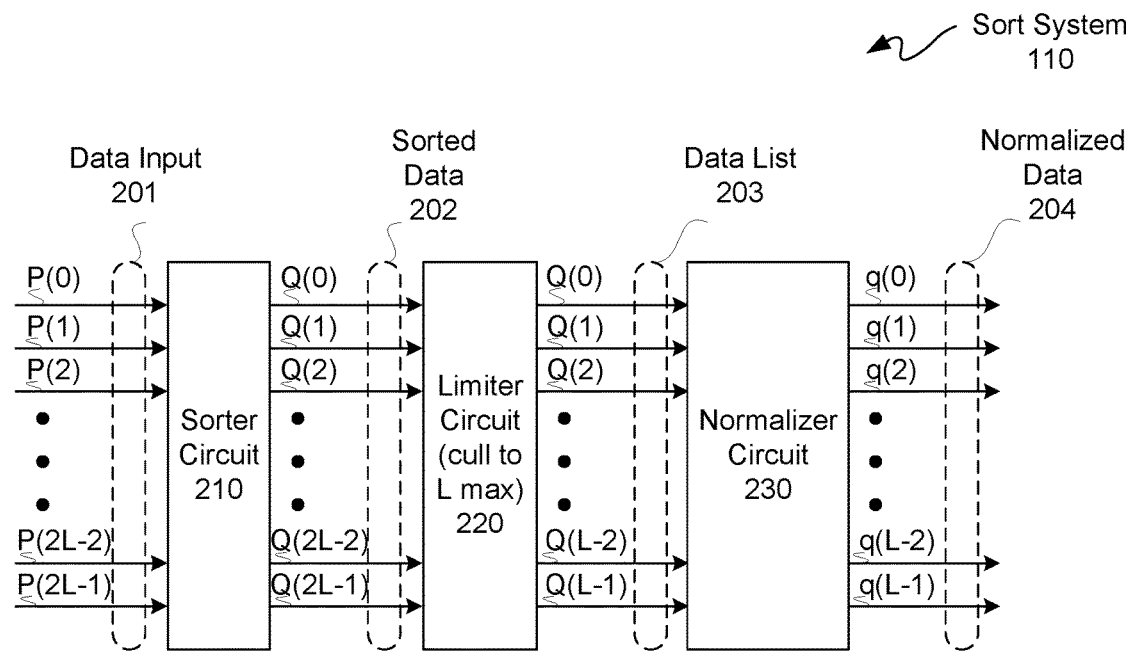
Figure 2:
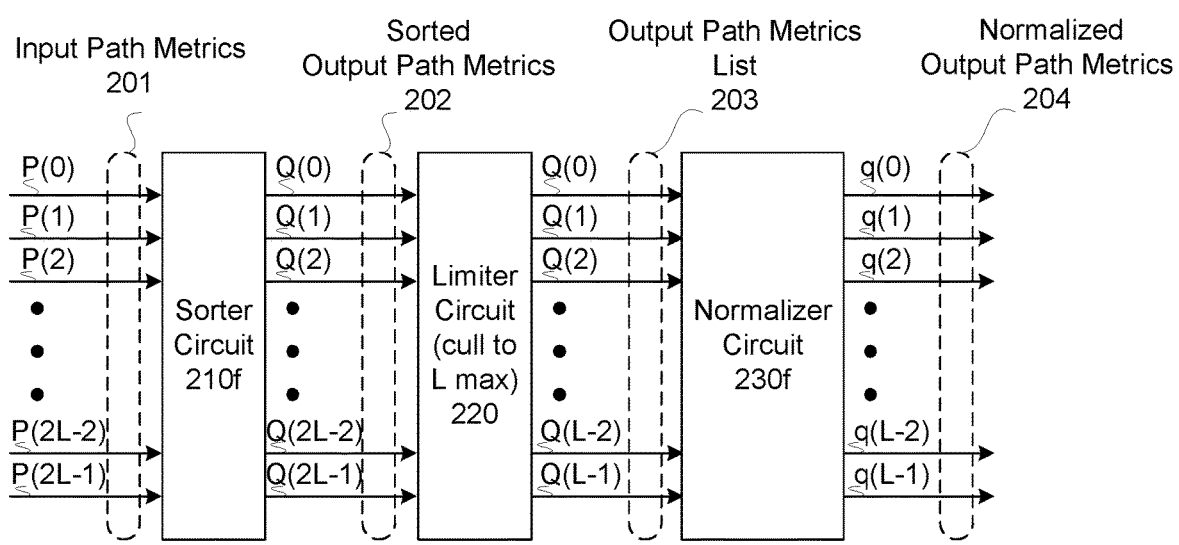
Figures 1, 3:
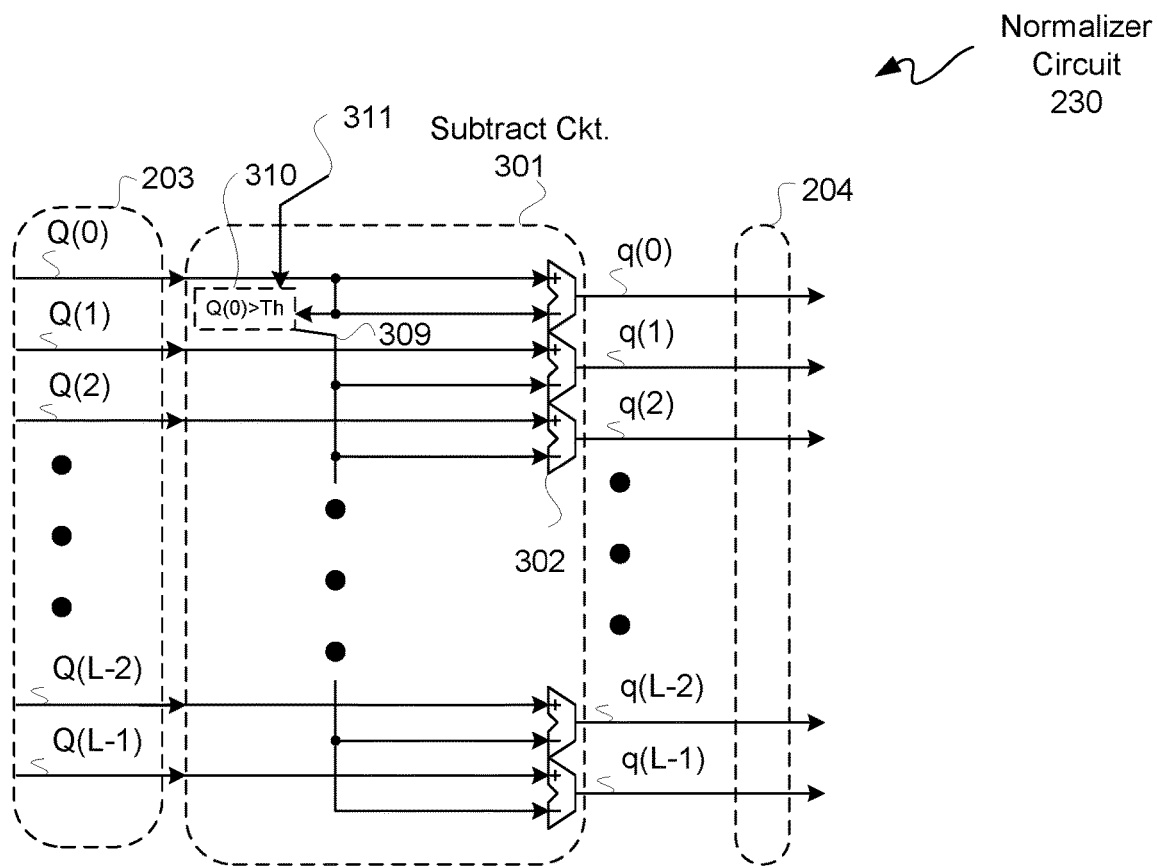
Figures 2, 3:
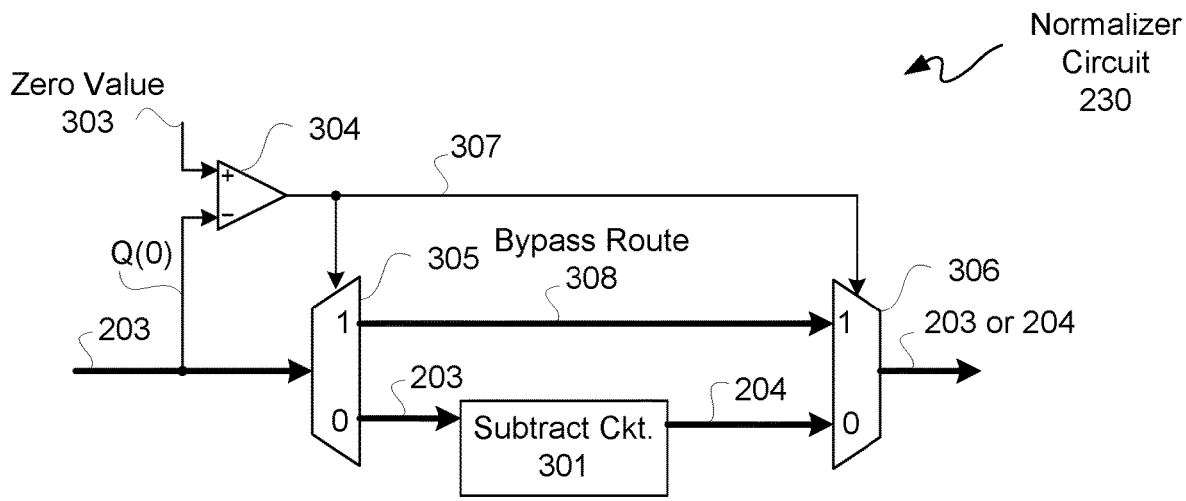

FIG. 1-3 is a block diagram depicting an exemplary data processing kernel 100 for an implementation of an SCL decoder 199. Data processing kernel 100 may include a datapath pipeline 101, a controller 102, memory 103, and memory interface bus 125. Instructions 150 for SCL decoding may be provided to controller 102 for corresponding dataset codewords 120 provided to memory 103 for processing one codeword at a time in data processing kernel 100.

Datapath pipeline 101 is configured for SCL decoding. In this example, upstream datapath functions 104 include corresponding upstream LLR processing circuits 104, including a tree circuit 131 and a decode-update circuit 132. In this example, downstream datapath functions 105 include downstream processing circuits 105, including a pointer-path circuit 134 and a decode-end circuit 135.

Even though the following description is directed at sort system 110 to mitigate risk of saturation while still using a small maximum path metric width or value, as previously described, it should be understood from FIGS. 1-1 through 1-3 that sort system 110 may be used in different data processing kernel 100 contexts. Even though the following description is particular to SCL decoding, other types of list decoding may benefit from technology described herein. Moreover, other types of data processing kernels using sorting and culling to constrain growth of dynamic range may benefit from technology described herein.

In SCL decoding, for each decoded bit, a path metric for each path is either left unchanged or increased by the absolute value of an LLR for that decoded bit. This decision is based on whether or not the decoded value of such bit for such path in question agrees with an expectation. An expectation is set by the value of a frozen bit, where such value is known from a priori knowledge of the type of bit being decoded, or the sign of an LLR for such bit, if such bit in question is an information bit.

Only information, and not frozen, bits get passed on for sorting and culling after updating of path metrics. However, in another example, a sort could be used after any type of bit, including a frozen bit. In SCL decoding, path metrics are updated prior to a sort, such as by sort system 110, by a decode-update circuit 132 for example. If a list size of path metrics grows beyond a set maximum, a cull, which may follow a sort, may be performed. Such a cull generally means that only L paths survive for a decode of the next bit.

FIG. 2-1 is a block diagram depicting an exemplary sort system 110. Sort system 110 includes a sorter circuit 210, a limiter or cull circuit 220, and a normalizer circuit 230. Data input 201 may be input path metrics 201. Sorted data 202 may be sorted output path metrics 202. Data list 203 may be output path metrics list 203. Normalized data 204 may be normalized output path metrics 204. Sort system 110 is not limited to sorting input path metrics for purposes of sorting a data input 201. However, the non-limiting example of sorting and further processing path metrics for list decoding is provided for purposes of clarity and not limitation.

A sorter circuit 210 may be configured to receive and sort data input 201 to provide sorted data 202. A limiter circuit 220 may be configured to cull sorted data 202 to a data list 203 provided, however, such sorted data exceeds a maximum number of L output paths. For L or less output paths for sorted data 202, data list 203 may be the same as sorted data 202, namely limiter circuit 220 passes sorted data 202 through as data list 203 in such instance.

Size of input and output sets of a sorter are equal, and in this example are a maximum of 2L, namely twice a cull threshold. For purposes of clarity by way of example and not limitation, assume a maximum number of 2L output paths from sorter circuit 210 is 32, and suppose on a pass for decoding an information bit through sort system 110, data input 201 includes path metrics for all input paths P(0) through P(2L−1). In such a pass, data input 201 results, after processing by sorter circuit 210, provide path metrics for all 32 output paths, namely 2L output paths, as sorted data 202 output from sorter circuit 210. In this example, 2L is the maximum number of input path metrics to sorter circuit 210 for a radix-2 decoder. In another example, a radix-4 decoder may be used, and so a maximum number of input path metrics to sorter circuit 210 may be 4L, and so on. In general, limiter circuit 220 of FIGS. 2-1 and 2-2 cuts a list of radix-L down to L elements.

In this example pass, sorted data 202 includes paths Q(0) through Q(2L−1) for this decoding pass. Limiter circuit 220 may cull paths Q(0) through Q(2L−1) of sorted data 202 to paths Q(0) through Q(L−1) of sorted data. Moreover, not every data input 201 needs to provide 2L path metrics to occupy all 2L input paths of sorter circuit 210, as fewer than a maximum number of path metrics to input paths may be input to sorter circuit 210 for a decoding pass. Furthermore, fewer than L path metrics for output paths of sorter circuit 210 may result for a decoding pass. In another example, a sorter circuit 210 may be configured to ignore any or all unused inputs. For example, a fixed input size sorter circuit 210 can be used, where unused input paths are given a path metric of a maximum value; in other words, each such input path having assigned a maximum path metric value does not factor into causing any "good" path to be culled.

A path metric is a confidence value indicating degree to which decoding decisions are believed to be correct. A path metric in SCL decoding is generated from LLRs. At the end of an SCL decoding process for a bit, a single LLR is left representing what an SCL decoder implementation of data processing kernel 100 considers to be representative of a decoded bit. Sign of such an LLR indicates whether a decoder considers such a bit to be positive or negative, such as for non-return to zero ("NRZ") signaling, which indicates whether such bit is believed to be a logic 1 or 0, respectively.

Such an LLR may be multiple bits long, and so a magnitude of an LLR indicates a degree of confidence that such positive or negative condition is correct. An LLR close to a maximum absolute value, such as close to a voltage logic level for NRZ signaling for example has a low path metric, and so such an LLR indicates a high degree of confidence in an associated sign of such LLR.

In contrast, an LLR close to a minimum absolute value, such as close to a zero voltage level for NRZ signaling for example, has a low degree of confidence in an associated sign of such LLR. Even though NRZ signaling is described for purposes of clarity by way of example, other types of signaling may be used in connection with list decoding.

For a simple example in list decoding of a first information bit, there is a first path indicating such first information bit is a logic 1 and a second path indicating such first information bit is a logic 0. A first path metric is associated with such first path to indicate confidence in such first path, and a second path metric is associated with such second path to indicate confidence in such second path. Successive cancelation operations may lead to more bifurcated decisions points or more paths, and hence more associated path metrics.

In list decoding, if a "bit confidence value" for a path mathematically agrees with sign of an associated LLR, such a "bit confidence value" remains unchanged. This unchanged value may be zero, which may be a highest confidence value for a path. If, however, a bit confidence value for a path mathematically disagrees with sign of an associated LLR, such bit confidence value for such a path is adjusted to indicate less confidence. Conventionally, adjusting a path metric involves increasing its absolute value to indicate less confidence. This increase in a path metric may be by addition of an absolute value of an LLR associated with such path metric. Addition of an associated LLR to such path metric may be used to indicate that such result "disagrees" with a likely decoding decision. However, even "disagreeing" path metrics may be tracked, unless culled, in the event such path is a correct decoding path for a list decoding process. For example, suppose a "parent" path gives birth to two "child" paths. Each of these child paths inherits a path metric from such parent and all the previously decoded bits of a codeword from such parent, but a different value is appended to the end of a decoder set each child path. For example, a parent path with 010 bits decoded so far will produce two child paths which describe the decoded codeword as 0100 and 0101, respectively. It is this appended value (0 or 1) which has to match the sign of an LLR to decide whether the path metric of a child is changed or left unaltered. If sign matches, then there is no change to a child path's path metric (i.e., such a child path will have the same path metric as its parent path), else the absolute value of an LLR is added (i.e., penalizing such a child path which is considered 'wrong').

Accordingly, multiple paths and associated path metrics may be generated to decode a bit. A sorter circuit 210 may in effect rank paths according to path metrics from a highest confidence value, such as for example a path metric value of zero, down to a lowest confidence value, such as a path metric value greater than zero that approaches a saturation value or level.

However, sorter circuit 210 further tracks input indices of data input 201, such as tracks input indices and input path metrics 201 together. For example, path metric P(0) has a path indexed to a topmost position in data input 201 in addition to a path metric value. However, after sorting by sorter circuit 210, such path metric P(0) may be one or more path metrics in sorted data 202. These one or more sorted path metrics may or may not include Q(0), namely a topmost position in sorted data 202. In short, order of data input 201 may be completely or somewhat jumbled or in a same order after output from sorter circuit 210 as sorted data 202.

Sorter circuit 210 not only sorts sorted data 202 from highest to lowest confidence values, or probabilities, but also tracks input indices of such data input 201. Input indices may be tracked as a change in index value. However, input indices may be implied by respective positions on input, and so tracking of same is not described in unnecessary detail herein.

In SCL decoding, there are information bits and "frozen" bits. Frozen bits are similar to parity bits. Based on location of a frozen bit in a codeword, state of another bit in such codeword may be known with a greater degree of certainty. If a path metric for a path disagrees with a frozen bit associated with such path, then in SCL decoding such path metric may be adjusted or penalized by having an absolute value of an associated LLR added to such path metric value by sorter circuit 210.

In list decoding, each bit of a block to be decoded is decoded in series, using the results of previously decoded bits to help decode subsequent bits. For each bit, datapath functions performed may differ depending on whether the bit in question is a frozen bit or an information bit. Moreover, such datapath functions performed may differ if a bit is a parity bit if some form of augmented SCL coding is being used. However, for purposes of clarity and not limitation, it shall be assumed that only information and frozen bits are present in SCL decoding.

For per-bit SCL decoding, if a current bit in a decoder for a data processing kernel 100 is a frozen bit, then an LLR calculation may be followed by a path metric update and then a partial summation or psum calculation before beginning a decode of a next bit. However if a current bit in question is an information bit, then an LLR calculation may be followed by a path metric update, a sort, a pointer manipulation, and a psum calculation before beginning a decode of such a next bit.

Furthermore, LLR and psum calculations are performed over a number of ranks of a decode trellis, as well as an SCL encode trellis, depending on an index of a bit being decoded.

If LLR and/or psum calculations are pipelined, then having different paths for frozen and information bits leads to having variable latency as to when such calculations may be performed. Psum calculations and LLR processing may be combined, because a psum calculation is always followed by LLR processing. Psum and LLR calculations may be performed using upstream LLR processing circuits 104, and thus are not described in unnecessary detail with respect to sort system 110.

However, it should be understood that psums may be different for each path, and so decoded LLRs may be different for each path. Thus, addition of an absolute value of an LLR to penalize a path may be different for different paths. The term LLR may describe a data type in the sense that single precision floating point representation is a data type. In Polar decoding, inputs are LLRs (of which there are $2^N$), but the output of a PU tree in Polar decoding processing is a single LLR. It is this single decoded LLR which describes what a decoder "thinks" of the confidence value of a bit being decoded, namely such a single decoded LLR describes both sign and confidence level in that bit.

Returning to adjusting a path metric responsive to a frozen bit state, some paths may agree with a frozen bit and other paths may disagree with a frozen bit. Thus some paths may be penalized with associated LLRs and other paths may not be penalized with associated LLRs responsive to disagreeing or agreeing with state of a frozen bit.

In view of the above-description, sorter circuit 210 may be configured to perform a bitonic or other sort as a bitonic sort network or other sorting network. A sorter circuit 210 may be a large circuit involving many circuit resources. Again, size of sorter circuit 210 is strongly related to path metric width or bit length. Again, path metric width size limit is determined by an LLR width plus $\log_2(N)$ bits, where N is the number of bits in a codeword, due to arithmetic bit growth. This is a largest possible implementation for a sorter circuit 210. However, in practice, since the highest path metric values are discarded or culled by limiter circuit 220, path metrics generally do not reach a path metric width size limit.

Conventionally, path metric widths are limited to an LLR width plus p where $p<\log_2(N)$. Even so, a lower workable value of p may be used by using normalization as described below.

In another implementation, not all bits of LLRs are used in determining values of path metrics. For example, only some of the most significant bits ("MSBs") may be used. While using only some of the MSBs of LLRs may be used, using such a subset of MSBs may degrade the ability of a sorter circuit 210 to choose the best paths.

Even though a limiter circuit 220 is shown separately from sorter circuit 210 for purposes of clarity, such limiter circuit 220 may be included in sorter circuit 210. Along those lines, a sorter circuit 210 may be configured to allow only the lowest M path metrics to be output from sorter circuit 210.

After sorted data 202 passes through limiter circuit 220, where such sorted data 202 is culled to a maximum of L path metrics, if applicable, an output of limiter circuit 220 is a data list 203. A data list 203 is a list of output path metrics 203 from lowest, at index or position (0), to highest, at index or position (L−1). If sorted data 202, such as sorted output path metrics 202, is equal to or less than L paths, then data list 203, such as output path metrics list 203, is the same as for sorted data 202. Otherwise, if sorted data 202, such as sorted output path metrics 202, is greater than L paths, then data list 203, such as output path metrics list 203, is the same as the L highest confidence values of sorted data 202. Generally, only the lowest L path metrics form such data list 203 for providing to normalizer 230.

A normalizer circuit 230, such as of a sort system 110 of a data processing kernel 100, may be configured to provide normalization of a received data list 203. This normalization may be performed on a per set basis of output path metrics in a list. In other words, normalization is performed on a per set basis for a codeword bit, as opposed to normalization over all bits of a codeword for example. A per set basis may be used as path metric values are used for their relative value to one another within a set for decoding a bit. As long as relative values, or differences between path metrics to one another are unchanged, such path metrics may be normalized without loss of information for purposes of decoding for example.

Normalizer circuit 230 may be configured to receive a data list 203, such as a list of output path metrics sorted according to their confidence values and to provide corresponding normalized data 204. For example, data list 203 may be output path metrics Q(0) through Q(L-1) for L paths, and normalized data 204 may be normalized output path metrics q(0) through q(L-1) without any change in ranking from output path metrics 203. For example, q(0) of normalized data 204 is a normalized version of Q(0) of data list 203.

With path metrics limited to some maximum value, namely saturated path metrics, there is the hazard that if path metrics of valid paths reach a saturated value level, then a sorter will no longer be able to select the best paths, because many of such path metrics match such saturation value. In other words, when a path becomes saturated it is conventionally not possible to determine between saturated path metrics which saturated path metric is genuinely worse than one or more other saturated path metrics. As a result having more than one saturated path metric, selection of which paths to eliminate or cull is degraded, and hence the likelihood of correct decoding likewise is degraded.

Again, because path metrics are used only for comparison with other path metrics, a path metric value may be subtracted from all path metrics without degrading the likelihood of correct decoding. In an example below, a smallest path metric is subtracted from all path metrics by normalizer circuit 230. However, in another example, a path metric value between 0 and the smallest path metric value input to normalizer circuit 230 may be subtracted from all path metric values input to normalizer circuit 230.

This normalizing operation can occur after the calculation of path metrics for each bit of a codeword as described below on a per set basis of path metrics basis. However, in another example, such a normalizing operation may occur less often. Indeed, a minimum path metric value to be subtracted may be set as a threshold for a normalization operation, and so a minimum path metric value detection circuit may be used to front a normalization operation.

Because a sorter circuit orders by path metrics, a further observation is that after each sort, the smallest path metric will be in the first position, or last position if the sorter is so configured, of a sorted output. In this example of SCL decoding, sort operations occur after each information bit is encountered in a codeword. The effect of normalization is to increase an effective saturation point. In other words, each normalization operation shifts path metrics away from a saturation level, such as a quasi-saw-tooth pattern for example. Each such normalization operation effectively prevents or postpones a point in time at which any path metric value reaches a saturation value or level.

This prevention or postponement of reaching a saturation level due to one or more normalization operations enhances a decoder's likelihood of correct decoding for a path metric width. In other words, by an end of a decoding process for a bit or a codeword, fewer, if any, path metrics reach a saturation level, and so decode performance is enhanced by maintaining an ability to differentiate between path metrics and by having more options for differentiating between path metrics. Furthermore, this prevention or postponement of reaching a saturation value may be obtained without any bit length growth. In other words, path metric width p for path metrics does not need to be made larger to avoid reaching a saturation value during decoding.

As decoding proceeds, even the best path metric can grow, and if such best path metric reaches a saturation level or value, then a decoder can no longer select the best path at each sort-cull operation sequence, and hence a failure to decode is substantially likely. However, by normalizing as described below, a best path metric is substantially less likely to reach a saturation level of value during decoding, and so a decoder is more likely to select the best path at each sort-cull operation sequence.

FIG. 2-2 is a block diagram depicting another exemplary sort system 110. FIG. 2-2 is the same as FIG. 2-1, except for the following differences. Input path metrics 201 may have an extra bit, namely a validity flag bit. Normalizer circuit 230 of FIG. 2-1 is replaced with normalizer circuit 230$f$, where normalizer circuit 230$f$ is configured to process each path incorporating a corresponding a validity flag bit, as described below in additional detail.

Along those lines, one or more paths may be invalid. To allow for tracking of such one or more invalid paths, each input path metric of input path metrics 201 may be accompanied by a validity flag bit. Accordingly, each path of sorted output path metrics 202, output path metrics list 203, and normalized output path metrics 204 may include an associated validity flag bit. A sorter circuit 210 of FIG. 2-1 is replaced with a sorter circuit 210$f$, where sorter circuit 210$f$ is configured to favor valid paths over invalid paths responsive to status of validity flag bits.

FIG. 3-1 is a circuit diagram depicting an exemplary normalizer circuit 230. In this example, normalizer circuit 230 includes a subtraction circuit or a plurality of subtractors 301. Each subtractor 302 of such plurality of subtractors 301 is configured to receive a smallest path metric value, Q(0) continuing the above example, of a data list 203 to a minus port respectively thereof. In another example, another path metric, other than a smallest path metric value, Q(0), of a data list 203 may be used. However, by using other than the smallest path metric value, normalization using subtraction may result in one or more negative normalized values. While using one or more negative values is possible, such an example involves have to track sign of such values, and so another bit, namely a sign bit, may be used.

In yet another example, a fixed value may be subtracted if a minimum path metric exceeds a threshold value. For example, in the event a current minimum path metric is greater than a threshold value of 16, then all path metrics, other than the current minimum path metric, would have 16 subtracted from each of them. By ensuring a threshold level for subtraction, smaller subtractors may be used in such an implementation. Along those lines, optionally, a smallest path metric value, Q(0), may be input to a comparator-multiplexer circuit 310. Comparator-multiplexer circuit 310 may be configured to compare a smallest path metric value, Q(0), to a set threshold value 311, which may be a fixed value. As long as a smallest path metric value, Q(0), does not exceed such a threshold value 311, a subtrahend or datum output 309 from comparator-multiplexer circuit 310 may be selected to be such a smallest path metric value, Q(0), for subtraction to provide q(1) through q(L−1) normalized values. However, if a smallest path metric value, Q(0), exceeds such a threshold value 311, a subtrahend or datum output 309 from comparator-multiplexer circuit 310 may be selected to be such a fixed threshold value 311. However, for purposes of clarity by way of example and not limitation, it shall generally be assumed that optional comparator-multiplexer circuit 310 outputs a smallest path metric value, Q(0), for subtrahend or datum output 309, for subtraction to provide q(1) through q(L−1) normalized values.

Plus ports of each subtractor 302 of a plurality of subtractors 301 are respectively coupled to receive output path metrics Q(0) through Q(L−1) of data list 203. In some instances, not all paths of data list 203 may be populated with a corresponding path metric value. Normalizer circuit 230 includes a plurality of subtractors 301 configured to subtract a metric, such as datum Q(0) path metric of output path metrics of data list 203, respectively from each entry of output path metrics Q(0) through Q(L−1) in data list 203.

Subtraction of a datum Q(0) from a datum Q(0) returns a zero value for a corresponding normalized path metric q(0) in normalized data 204. Assuming all other path metrics of Q(1) through Q(L−1) of data list 203 are larger values than datum Q(0), then all other corresponding normalized path metrics q(1) through q(L−1) of normalized data or normalized data list 204 are greater than zero, as path metric values are positive values. In short, in this example, each path metric in data list 203 is normalized to or with a highest confidence value for such set of outcomes, namely such set of output path metrics.

In this example, normalizer 230 is configured, for each bit in post a sort-cull list decode sequence for an information bit, to subtract a datum Q(0) from an output path metric Q(0) in a data list 203 to return a zero value and to subtract such same datum Q(0) from each of a remainder of output path metrics in such a data list (203). If normalized path metrics q(0) through q(L−1) of normalized data 204 were plotted before and after normalization from bit decode index (0) to (L−1), a ramp from lowest path metric to highest path metric of a data list 203 would be seen to be shifted down to start at zero in a corresponding ramp of a normalized data list 204 of such data list 203, which plot would appear as a quasi-saw-tooth-like pattern.

This shifting down to zero by normalized data 204 shifts all path metric values in such normalized data away from reaching a saturation value or level. By having a normalizer circuit 230 configured to subtract a datum Q(0) of a data list 203 having a highest confidence value (i.e., a lowest path metric) from each entry in such data list 203 to provide normalized data 204 reaching a saturation level may be prevented or postponed for one or more path metrics for a decode of a bit or a codeword. While normalization may be performed for a set of data, namely path metrics of a data list 203, for each information bit each time same is processed through a sort-cull sequence, a less demanding use of normalization may be used.

Along those lines, FIG. 3-2 is a circuit diagram depicting another exemplary normalizer circuit 230. In this example, normalizer circuit 230 includes a subtraction circuit 301, as well as a comparator 304, a demultiplexer 305, and a multiplexer 306.

In this example, comparator 304 is configured to receive datum Q(0) to a minus port thereof and a zero value 303 to a plus port thereof for comparison to provide a select signal 307. In another example, a different path metric, such as larger than the smallest path metric value in a data list 203, may be used as an input to comparator 304 for comparison to a positive value larger than zero value 303. In this example, for values of datum Q(0) greater than zero, select signal 307 effectively is a logic 0, and for values of datum Q(0) equal to zero (i.e., datum Q(0) is never less than zero in this example), select signal 307 is effective a logic 1.

Demultiplexer 305 may be coupled to receive data list 203 as an input. Demultiplexer 305 may be configured responsive to select signal 307 to provide data list 203 either to subtractor circuit 301, as previously described for a plurality of subtractors 301, or a bypass route 308 to bypass such subtractor circuit 301 or plurality of subtractors 301. In this example, for datum Q(0) greater than zero, select signal 307 causes demultiplexer 305 to provide data list 203 to subtractor circuit 301, and for datum Q(0) equal to zero, select signal 307 causes demultiplexer 305 to provide data list 203 to bypass route 308.

Multiplexer 306 may be configured to output either normalized data 204 or data list 203 responsive to the select signal 307. In this example, for datum Q(0) greater than zero, select signal 307 causes multiplexer 306 to output normalized data 204 from subtractor circuit 301, and for datum Q(0) equal to zero, select signal 307 causes multiplexer 306 to output data list 203 from bypass route 308.

Thus, in this example, normalization is not performed for each sort operation of a list decoding sequence of operations on a bit, rather such normalization is performed only for instances when datum Q(0) is greater than zero.

To this point, it has generally been assumed that all path metrics in data input 201 are in a non-saturated state. However, one or more path metrics in data input 201, sorted data 202, data list 203, and/or normalized data 204 may be in a saturated state. If one or more path metrics in normalized data 204 is at a saturated value, then subtracting a smallest path metric from such saturated value does not assist or advance decoding and consumes energy for non-zero values of such a smallest path metric. In other words, once a path metric is saturated, a path associated therewith, even if it survives culling, is to be considered invalid, and such an invalid path should stay invalid, namely not be resurrected by subtracting a non-zero path metric from such invalid path.

Figures 1, 4:
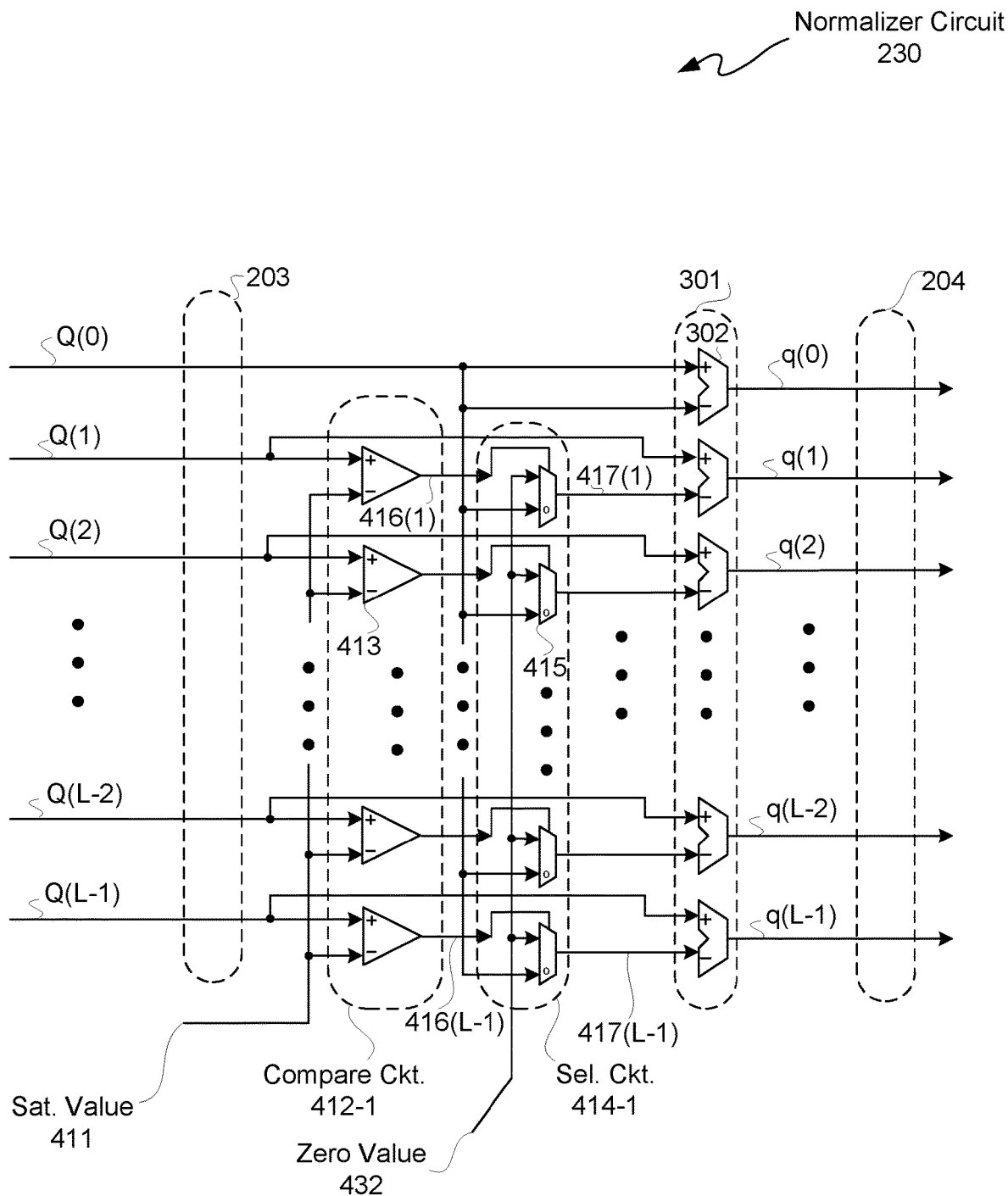
Figures 2, 4:
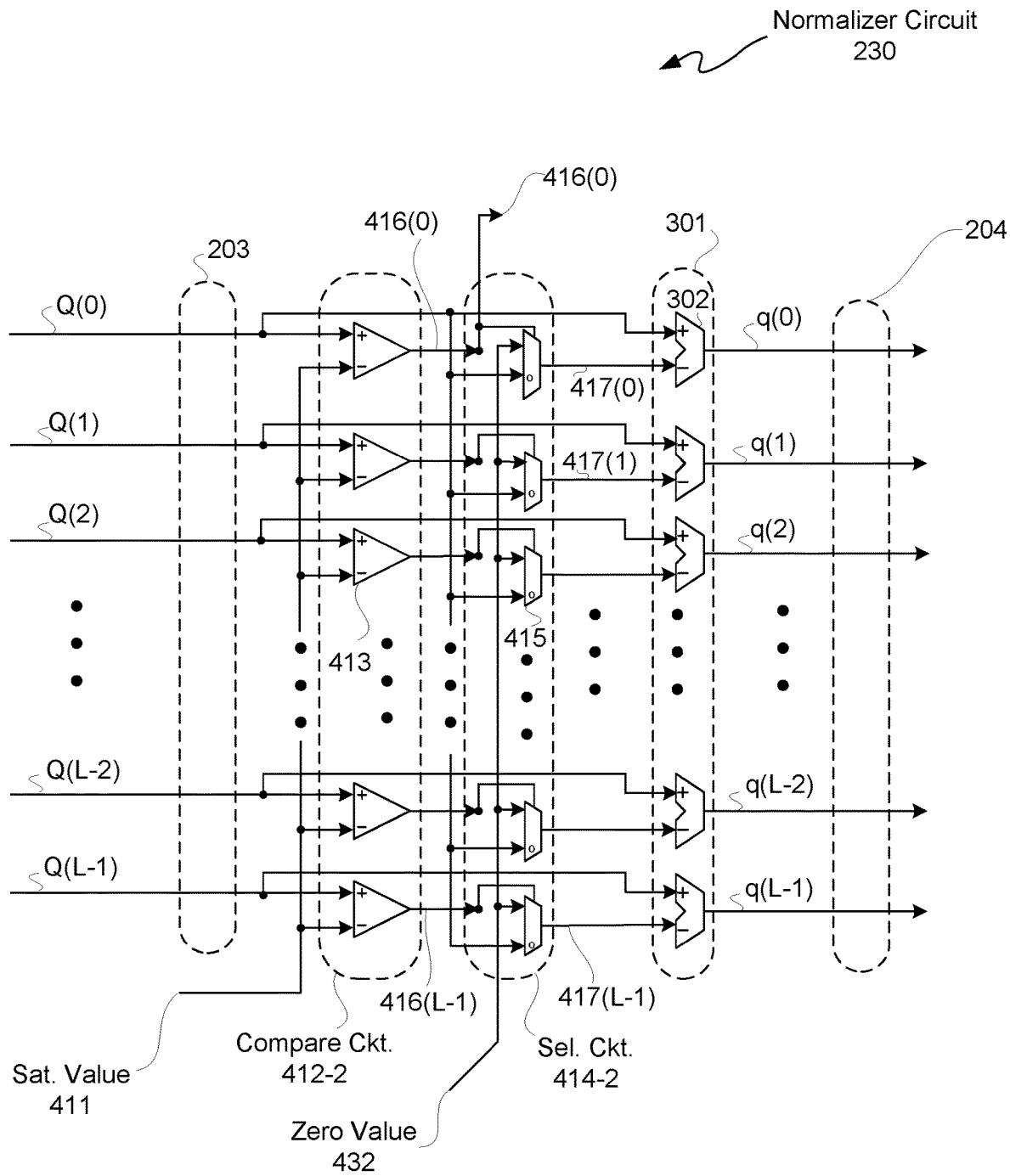
Figures 3, 4:
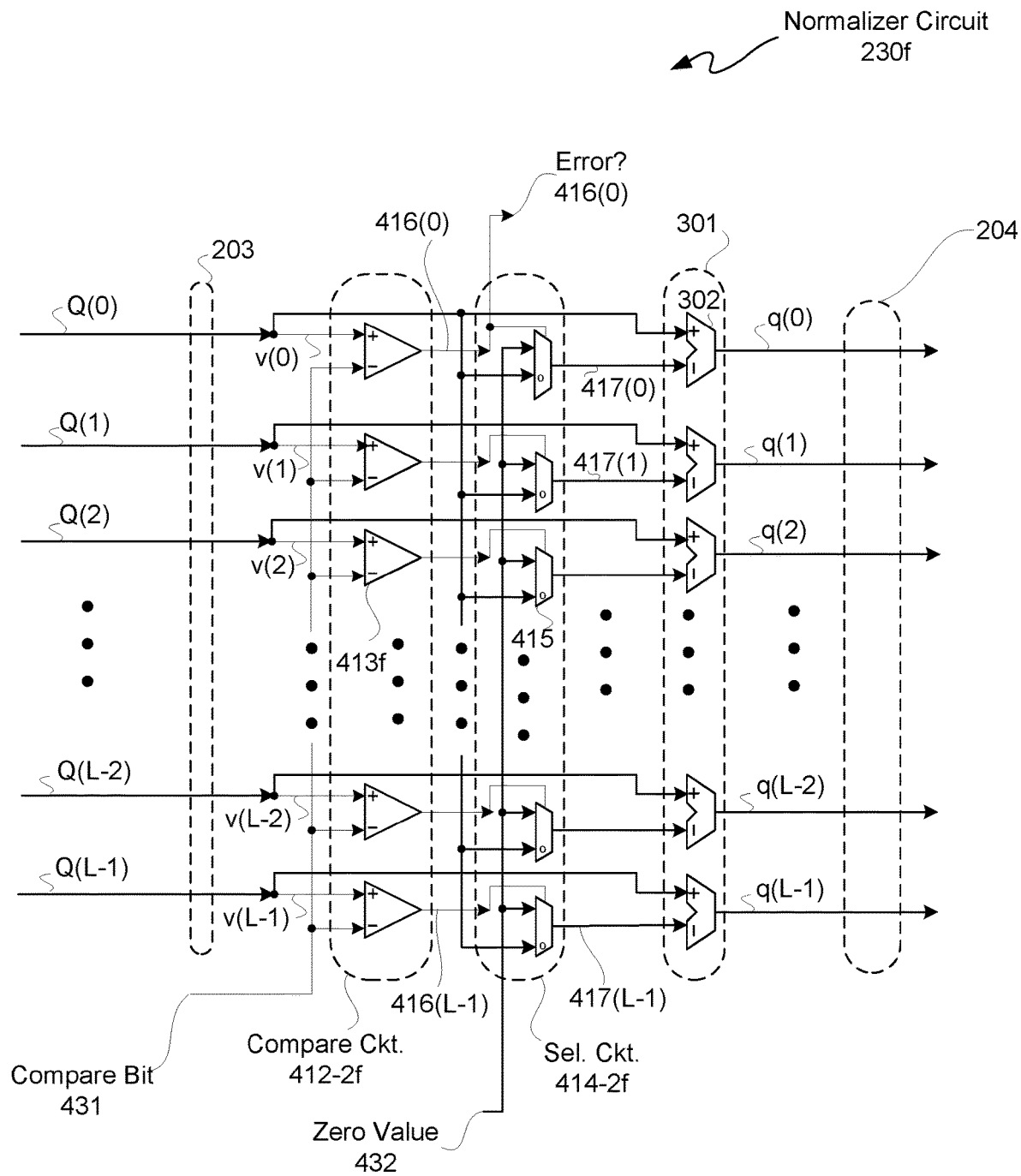

Along those lines, FIG. 4-1 is a circuit diagram depicting yet another exemplary normalizer circuit 230, and FIG. 4-2 is a circuit diagram depicting still yet another exemplary normalizer circuit 230. Normalizer circuits 230 of FIGS. 4-1 and 4-2 may optionally be used with a comparator 304, a demultiplexer 305, and a multiplexer 306 as in normalizer circuit 230 of FIG. 3-2.

With reference to normalizer circuit 230 of FIG. 4-1, such normalizer circuit 230 includes a compare circuit or a plurality of comparators 412-1 configured to respectively compare entries in a data list 203 other than a datum Q(0) with a saturation value 411 to provide either a first logic state or a second logic state for each comparison to generate a plurality of compare outputs 416(1) through 416(L−1). In this example, saturation value 411 is provided to minus ports of each of comparators 413 of comparators 412-1, and output path metrics Q(1) through Q(L−1) of data list 203 are respectively provided to plus ports of comparators 413 of compare circuit 412-1. However, in another example, minus and plus port inputs may be reversed. Effectively, because a saturation value 411 is a highest value for operation of this circuit, comparators 412-1 are equality detectors. Comparators 412-1 output a logic 1 when data inputs are equal, namely when a saturated value is detected for an output path metric in data list 203; otherwise, comparators 412-1 output a logic 0.

Compare outputs 416(1) through 416(L−1) of comparators 412-1 are respectively provided as control select inputs to a select circuit or a plurality of multiplexers 414-1 corresponding to such compare circuit or plurality of comparators 412-1. Each multiplexer 415 of such plurality of multiplexers 414-1 is configured to receive a corresponding compare output of such plurality of compare outputs 416(1) through 416(L−1) as a select signal. Each multiplexer 415 of such plurality of multiplexers 414-1 is configured to receive a zero value 432 and a datum Q(0) to respective data input ports for selection therebetween responsive to a select signal, to respectively provide a plurality of multiplexer outputs 417(1) through 417(L−1). Zero value 432 is a number of bits, each of which is a logic zero. Zero value 432 may be the same or similar to zero value 303. Multiplexer outputs 417(1) through 417(L−1) are provided respectively selected responsive to such plurality of compare outputs 416(1) through 416(L−1) as corresponding select signals. In another example, other selection logic may be used.

If, for example, Q(L−1) is less than a saturation value 411, then compare output 416(L−1) of a bottommost comparator 413 of plurality of comparators 412-1 is a logic 0. For a logic 0 for compare output 416(L−1), a corresponding bottommost multiplexer 415 of multiplexers 414-1 selects datum Q(0) for a multiplexer output 417(L−1). Multiplexer output 417(L−1) is provided to a minus port of a corresponding subtractor 302 of subtraction circuit 301, and a path metric Q(L−1) of a data list 203 is provided to a plus port of such subtractor 302. Such bottommost subtractor 302 in this example outputs normalized data q(L−1) of normalized data 204.

However, if, for example, Q(L−1) is equal or greater than to a saturation value 411, then compare output 416(L−1) of a bottommost comparator 413 of plurality of comparators 412-1 is a logic 1. In this example, an output path metric may exceed a saturation value or threshold 411; however, in another example, an output path metric may be clipped or otherwise set to be at most a saturation value.

For a logic 1 for compare output 416(L−1), such bottommost multiplexer 415 selects a zero value 432, namely each bit is a logic 0, for a multiplexer output 417(L−1). Multiplexer output 417(L−1) is provided to a minus port of a corresponding subtractor 302 of subtractors 301, and a path metric Q(L−1) of a data list 203 is provided to a plus port of such subtractor 302. Such bottommost subtractor 302 in this example outputs unchanged, namely not normalized on this pass, data Q(L−1) as data q(L−1).

As unchanged data q(L−1) is at a saturation level, subtraction by a zero value has no impact to such data. Moreover, subtraction having no change from input to output has less transitioning of transistors, and thus consumes less energy for such subtraction operation.

More generally, for each logic 0 of compare outputs 416(1) through 416(2L−1) in this example, a corresponding multiplexer 415 of multiplexers 414-1 selects datum Q(0) for a corresponding multiplexer output of multiplexer outputs 417(1) through 417(L−1). Conversely, for each logic 1 of compare outputs 416(1) through 416(L−1) in this example, a corresponding multiplexer of multiplexers 414-1 selects a zero value 432 for a corresponding multiplexer output of multiplexer outputs 417(1) through 417(L−1). Additionally, in this example, an uppermost subtractor 302 of a plurality of subtractors 301 is configured to subtract datum Q(0) from itself to provide a zero value output for normalized data q(0) of normalized data 204.

In this example, an uppermost subtractor 302 of a plurality of subtractors 301 is configured to directly subtract datum Q(0) from itself without first passing through a multiplexer 415. Accordingly, differences respectively output from a plurality of subtractors 301 as normalized data 204 may include downward shifted data, namely shifted away from a saturation level toward or to a zero path metric value, or a combination of downward shifted data and unchanged saturated data.

With reference to normalizer circuit 230 of FIG. 4-2, such normalizer circuit 230 includes a compare circuit 412-2, namely a plurality of comparators 412-2, configured to respectively compare each entry in a data list 203 with a saturation value 411 to provide either a first logic state or a second logic state for each comparison to generate a plurality of compare outputs 416(0) through 416(L−1). In this example, saturation value 411 is provided to minus ports of each of comparators 413 of compare circuit 412-2, and output path metrics Q(0) through Q(L−1) of data list 203 are respectively provided to plus ports of comparators 413 of compare circuit 412-2. However, in another example, minus and plus port inputs may be reversed.

Compare outputs 416(0) through 416(L−1) of compare circuit 412-2 are respectively provided as control select inputs to a select circuit 414-2, namely a plurality of multiplexers 414-2 corresponding to such plurality of comparators 412-2. Each multiplexer 415 of such plurality of multiplexers 414-2 is configured to receive a corresponding compare output of such plurality of compare outputs 416(0) through 416(L−1) as a select signal. Each multiplexer 415 of such plurality of multiplexers 414-2 is configured to receive a zero value 432 and a metric, such as a datum Q(0) for example, to respective data input ports for selection between such data inputs, to respectively provide a plurality of multiplexer outputs 417(0) through 417(L−1). Multiplexer outputs 417(0) through 417(L−1) are provided respectively responsive to such plurality of compare outputs 416(0) through 416(L−1) as corresponding select signals. In another example, other selection logic may be used.

The same description with respect for example to a bottommost comparator 413, a bottommost multiplexer 415, and a bottommost subtractor 302 is not repeated for purposes of clarity and not limitation.

More generally, for each logic 0 of compare outputs 416(0) through 416(L−1) in this example, a corresponding multiplexer 415 of multiplexers 414-2 selects datum Q(0) for a corresponding multiplexer output of multiplexer outputs 417(0) through 417(L−1). Conversely, for each logic 1 of compare outputs 416(0) through 416(L−1) in this example, a corresponding multiplexer 415 of multiplexers 414-2 selects a zero value 432 for a corresponding multiplexer output of multiplexer outputs 417(0) through 417(L−1).

However, in this example, an uppermost subtractor 302 of a plurality of subtractors 301 is configured to subtract datum Q(0) from itself or from a zero value 432. The former outcome is to provide a zero value output for normalized data q(0) of normalized data 204. The latter outcome, in the unlikely event that Q(0) is at a saturated level, indicates a decoder is disabled from selecting paths correctly within such a list. Along those lines, compare output 416(0) may be provided as an alert indicator signal 416(0), where a logic 0 in this example for alert indicator signal 416(0) indicates no saturation state for Q(0), and where a logic 1 in this example for alert indicator signal 416(0) indicates a saturation state for Q(0).

Accordingly, differences respectively output from a plurality of subtractors 301 as normalized data 204 may include: downward shifted data, namely shifted away from a saturation level toward or to a zero path metric value; a combination of downward shifted data and unchanged saturated data; or all unchanged saturation data.

Sorter system 110, including some or all of sorter circuit 210 or 210f (described below), limiter circuit 220, and normalizer circuit 230 or 230f (described below), may be implemented in an ASIC or other dedicated hardware and/or instantiated using programmable resources of a programmable logic device, such as for example an FPGA or other IC having programmable logic resources. However, programmable resources may provide additional ability to scale sorter system 110 for various sizes of data input 201.

As previously described, frozen bits are similar to, but are not technically, parity bits. While the above-description was limited to frozen and information bits, in another example, parity bits may be used in addition to frozen bits and information bits in list decoding. In such an implementation, parity bits may be used to disqualify paths in a sorter circuit, regardless of using an LLR to penalize such a path. For example, a path metric for a path disqualified by a parity bit may be set to a saturation value. This may result in such path being culled by a limiter circuit on a pass. In another example, a path metric for such disqualified path may be given an invalid value to immediately cull such path from a sorter system. Furthermore, rather than a saturation value and an invalid value, an invalid value may be used for both. However, for purposes of clarity by way of example and not limitation, a saturation value was described to indicate a purpose of normalization; however, in another example a path metric reaching a saturation level may be automatically set to an invalid value so as to be prevented from subsequently being used in a decoding sequence.

FIG. 4-3 is a circuit diagram depicting an exemplary normalizer circuit 230f. There may be one or more invalid paths, and accordingly a validity flag bit may be used. In this example, output path metrics in a resulting data list 203 may be passed to a normalizer circuit 230f, where each of such output path metrics includes a validity flag bit. Such a validity flag bit may be set so only valid paths, which may include one or more paths with corresponding saturated path metrics, are normalized by normalizer circuit 230f.

In this example, a validity flag bit is appended as a the top bit or MSB of a path metric, so each of output path metrics Q(0) through Q(L−1) in a resulting data list 203 may include a corresponding validity flag bit v(0) through v(L−1). Such validity flag bit, v, may be checked to see if same is set by corresponding comparators 413f of compare circuit 412-2f. Each of such validity flag bits v(0) through v(L−1) may be respectively provided to a corresponding single-bit comparator 413f for comparison with a compare bit 431. Comparators 413f are used for purposes of clarity by way of consistency; however, other circuits may be used to test a validity flag bit, v, to determine if such bit is flipped.

If a validity flag bit, v, for a path is set, or flipped, to indicate such a path is invalid, then such path metric associated therewith is passed without normalization. Otherwise, for a default unset condition of a validity flag bit, v, a path metric associated therewith is normalized. A decode update circuit 132 of FIG. 1-3 may be configured to set status of a validity flag bit, v, for a corresponding path depending on whether such path agrees with the expectation value of a parity or frozen bit. Along those lines, a sorter circuit 210f may be configured to favor valid paths over invalid paths responsive to status of validity flag bits. To elaborate, paths at this point are child paths, namely hypothetical extensions of their parent paths. Of the two child paths of a parent, one child path will have a logic 0 on the end of its bit confidence value and the other child path will have logic 1 on the end of its bit confidence value. The expectation of a frozen bit will be a 0, whereas the expectation for a parity bit is a function of previous bits. The parent path is an input to such a parity expectation calculation. If a parity expectation is a logic 1, then an associated child path having the logic 1 appended will be unaffected, and an associated child path with the logic 0 appended will be invalidated. It is possible for a parent path to be invalid, in which case both child paths inherit this invalidity. Once invalid, a path cannot become valid in a subsequent generation.

With reference to normalizer circuit 230f of FIG. 4-3, such normalizer circuit 230f includes a compare circuit 412-2f, namely a plurality of comparators 412-2f, configured to respectively compare each entry in a data list 203 with a compare bit 431 to provide either a first logic state or a second logic state for each comparison to generate a plurality of compare outputs 416(0) through 416(L−1). In this example, compare bit 431 is provided to minus ports of each of single-bit comparators 413f of compare circuit 412-2f, and validity flag bits v(0) through v(L−1) respectively of output path metrics Q(0) through Q(L−1) of data list 203 are respectively provided to plus ports of comparators 413f of compare circuit 412-2f. However, in another example, minus and plus port inputs may be reversed.

Compare outputs 416(0) through 416(L−1) of compare circuit 412-2f are respectively provided as control select inputs to a select circuit 414-2f, namely a plurality of multiplexers 414-2f corresponding to such plurality of comparators 412-2f. Each multiplexer 415 of such plurality of multiplexers 414-2f is configured to receive a corresponding compare output of such plurality of compare outputs 416(0) through 416(L−1) as a select signal. In this example, for a logic 1 output from a compare output 416, a top data input of a multiplexer 415 is selected. However, in another example, this selection logic may be reversed.

Each multiplexer 415 of such plurality of multiplexers 414-2 is further configured to receive a datum Q(0), or other datum as may be used, to a bottom data input port and to receive a zero value 432 to a top data port for selection therebetween responsive to a corresponding compare output 416.

Multiplexer 414-2f may respectively provide a plurality of multiplexer outputs 417(0) through 417(L−1). Multiplexer outputs 417(0) through 417(L−1) are selectively provided respectively responsive to such plurality of compare outputs 416(0) through 416(L−1) as corresponding select signals. In another example, other selection logic may be used.

More generally, for each logic 0 of compare outputs 416(0) through 416(L−1) in this example, a corresponding multiplexer 415 of multiplexers 414-2 selects datum Q(0) for a corresponding multiplexer output of multiplexer outputs 417(0) through 417(L−1). Conversely, for each logic 1 of compare outputs 416(0) through 416(L−1) in this example, a corresponding multiplexer 415 of multiplexers 414-1 selects a zero value 432 for a corresponding multiplexer output of multiplexer outputs 417(0) through 417(L−1).

However, in this example, an uppermost subtractor 302 of a plurality of subtractors 301 is configured to subtract datum Q(0) from itself or a zero value. The former outcome is to provide a zero value output for normalized data q(0) of normalized data 204. The latter outcome is in the unlikely event that Q(0) is at a saturated level, which indicates a decoding alert status has occurred. Along those lines, compare output 416(0) may be provided as an alert indicator signal 416(0), where a logic 0 in this example for alert indicator signal 416(0) indicates no saturation state for Q(0), and where a logic 1 in this example for alert indicator signal 416(0) indicates a saturation state for Q(0).

Figures 1, 5:
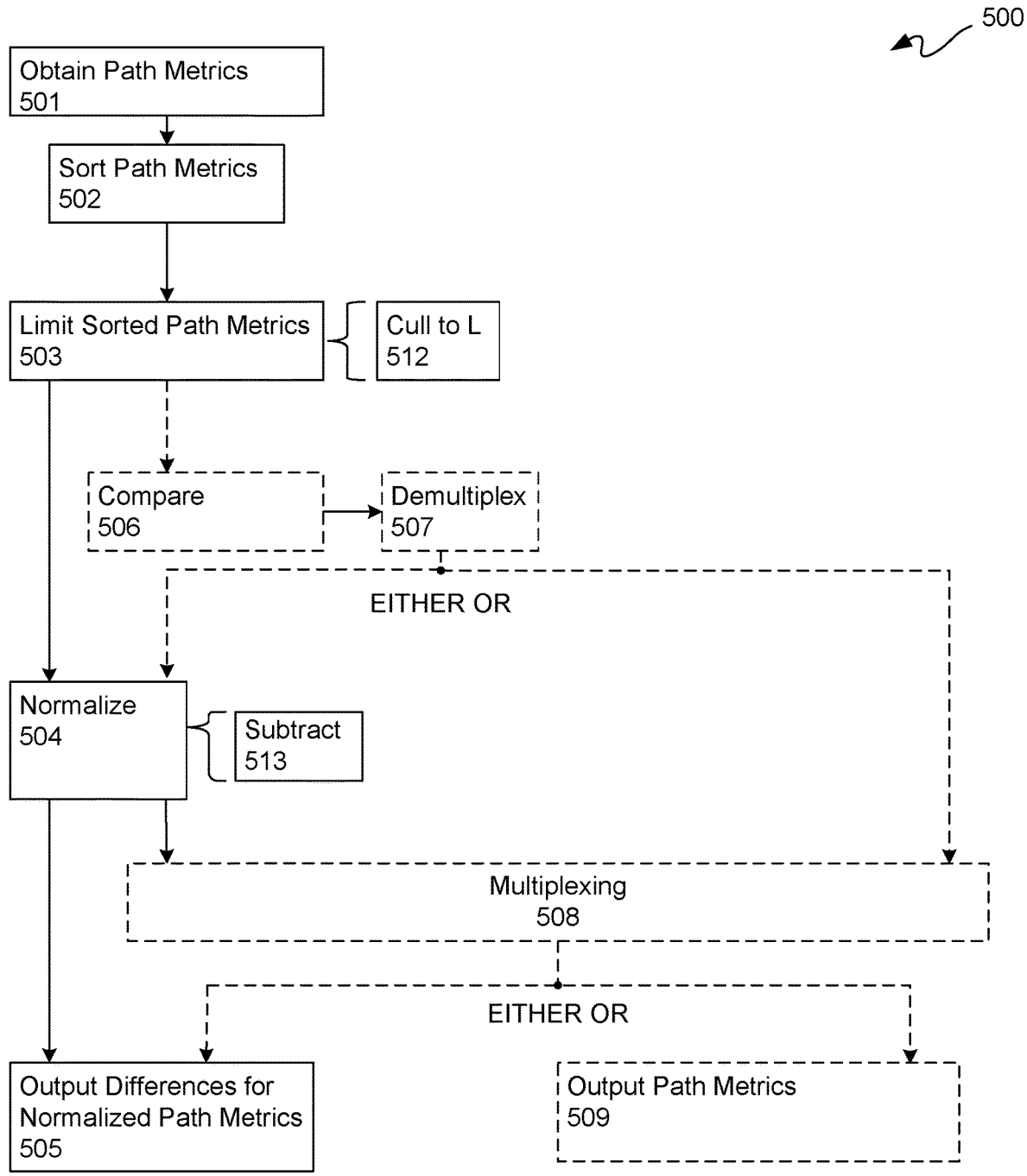
Figures 2, 5:
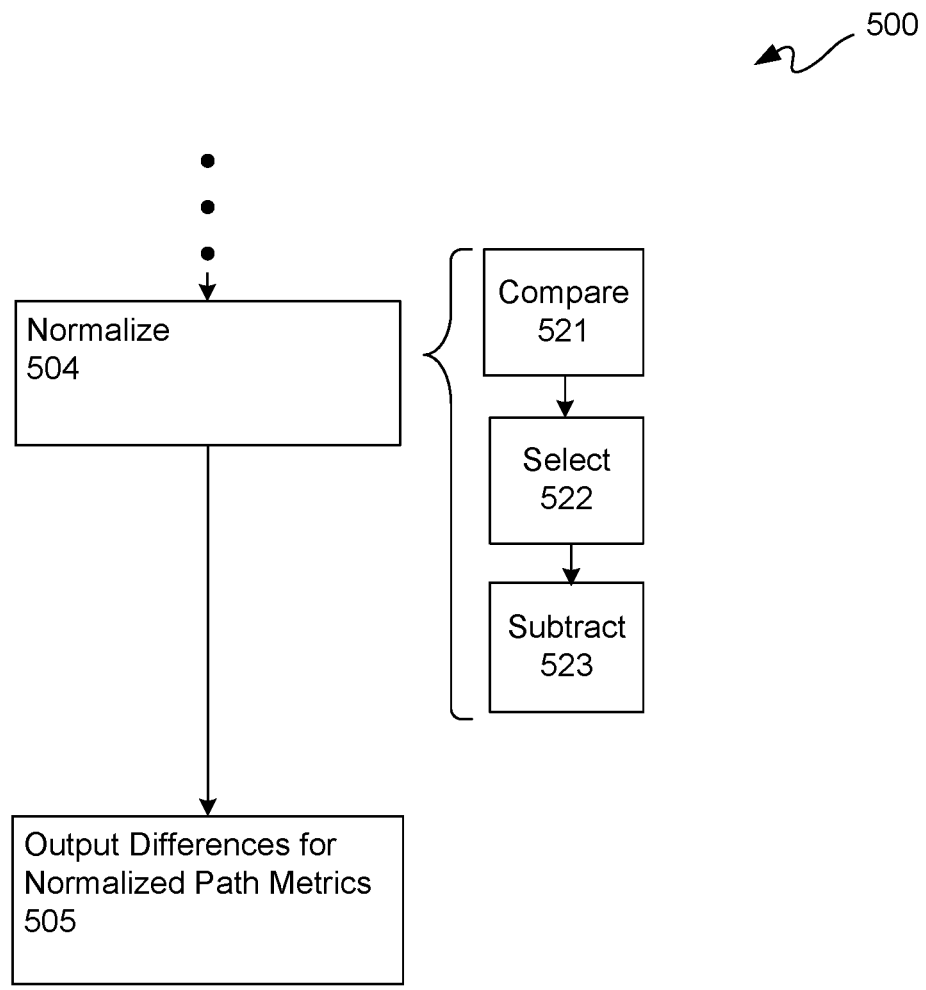

FIG. 5-1 is a flow diagram depicting an exemplary decoding process 500 for processing data. Decoding process 500 is described further with simultaneous reference to FIGS. 1-1 through 5-1.

At operation 501, a plurality of input path metrics 201 is obtained by a sorter circuit 210. At operation 502, sorter circuit 210 sorts such plurality of input path metrics 201 to provide a plurality of output path metrics 202. Sorting at operation 502 may be from lowest to highest, or vice versa.

At operation 503, a limiter circuit 220, which may or may not be incorporated into sorter circuit 210, culls, if applicable, such plurality of output path metrics 202 to allow at most a maximum number M output path metrics representing a data list 203 of a plurality of highest confidence values, namely lowest path metrics of such plurality of output path metrics 202. Output path metrics in a resulting data list 203 may be passed to a normalizer circuit 230. However, culling at operation 512 for operation 503 may or may not take place depending on whether a number of output path metrics 202 input to such limiter circuit 220 is greater than M or not, as previously described.

Operations 506 through 509 are optional. Operations 506 through 509 may be used to bypass normalization, so normalization is not necessarily applied after each sort operation. For now for purposes of clarity, it shall be assumed that operations 504 and 505 sequentially follow from operation 503.

At operation 504, normalizer circuit 230 normalizes data list 203. This normalization may include subtracting at operation 513 a highest (i.e., a lowest path metric value in a set), or other confidence value of such plurality of highest confidence values such as a datum Q(0) for example, from each entry in such a data list 203.

At operation 505, a plurality of differences, such as q(0) through q(L−1), from subtracting at operation 513 may be output as normalized data 204 of such data list 203. Again, normalized data 204 may include all shifted downward data or a combination of shifted downward data and saturated data.

Assuming operations 506 through 509 are used, then from operation 503 a comparing operation 506 may be performed by a comparator 304 to compare a datum (Q), such as datum Q(0) for example, and a zero value 303 to provide a select signal 307. At operation 507, a demultiplexer 305 responsive to select signal 307 demultiplexes data to provide such a data list 203 either to a normalizer circuit 230/230f, such as may include a plurality of subtractors 301, or a bypass route 308, the latter of which is to bypass such normalizer circuit 230/230f.

At operation 508, a multiplexer 306 multiplexes data to output either such normalized data 204 at operation 505 or such data list 203 at operation 509 responsive to select signal 307. At operation 509, a data list 203, which may be a limited set of output path metrics 202, may optionally be output instead of normalized data 204 for a post-sort decoding pass.

FIG. 5-2 is a flow diagram depicting another exemplary decoding process 500 for processing data. Decoding process 500 is described further with simultaneous reference to FIGS. 1-1 through 5-2. Operations 501 through 503 and 505 are the same as previously described, and so description of same is not repeated for purposes of clarity.

At operation 504, normalizer circuit 230 normalizes data list 203. This normalization may include subtracting at operation 513 a highest (i.e., a lowest path metric value in a set), or other confidence value of such plurality of highest confidence values such as a datum Q(0) for example or a zero value 432, from each entry in such a data list 203. For saturated values or invalid paths in data list 203, normalization at operation 504 may include subtraction of a zero value result 416 from a compare or zero value 432, as previously described.

Operation 504 may include operations 521 through 523. At operation 521, at least a subset of entries in a data list 203 may be respectively compared to a saturation value 411 to provide a plurality of compare outputs 416, which can be either compare outputs 416(0) through 416(L−1) or 416(1) through 416(L−1). However, in another example, at operation 521 validity flag bits, v(0) through v(L−1), entries in a data list 203 may be respectively compared to a compare bit 431 to provide a plurality of compare outputs 416(0) through 416(L−1) as select signals.

At operation 522, responsive to such plurality of compare outputs 416, either a zero value or a datum, such as datum Q(0), for example may be selected for subtraction from a corresponding output path metric of a data list 203, or a subset thereof, as previously described.

At operation 523, such datum Q(0) for example may be subtracted from each non-saturated or each valid entry in such data list 203 to provide a first portion of a plurality of differences, including subtraction of a datum Q(0) from itself to return a zero value. Operation 523 may further include subtracting a zero value from each saturated entry or invalid entry in such a data list 203 to provide a second portion of such plurality of differences. Again, in this example, such a data list 203 is for SCL decoding, but in another example may be of another type of list decoding.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 6:
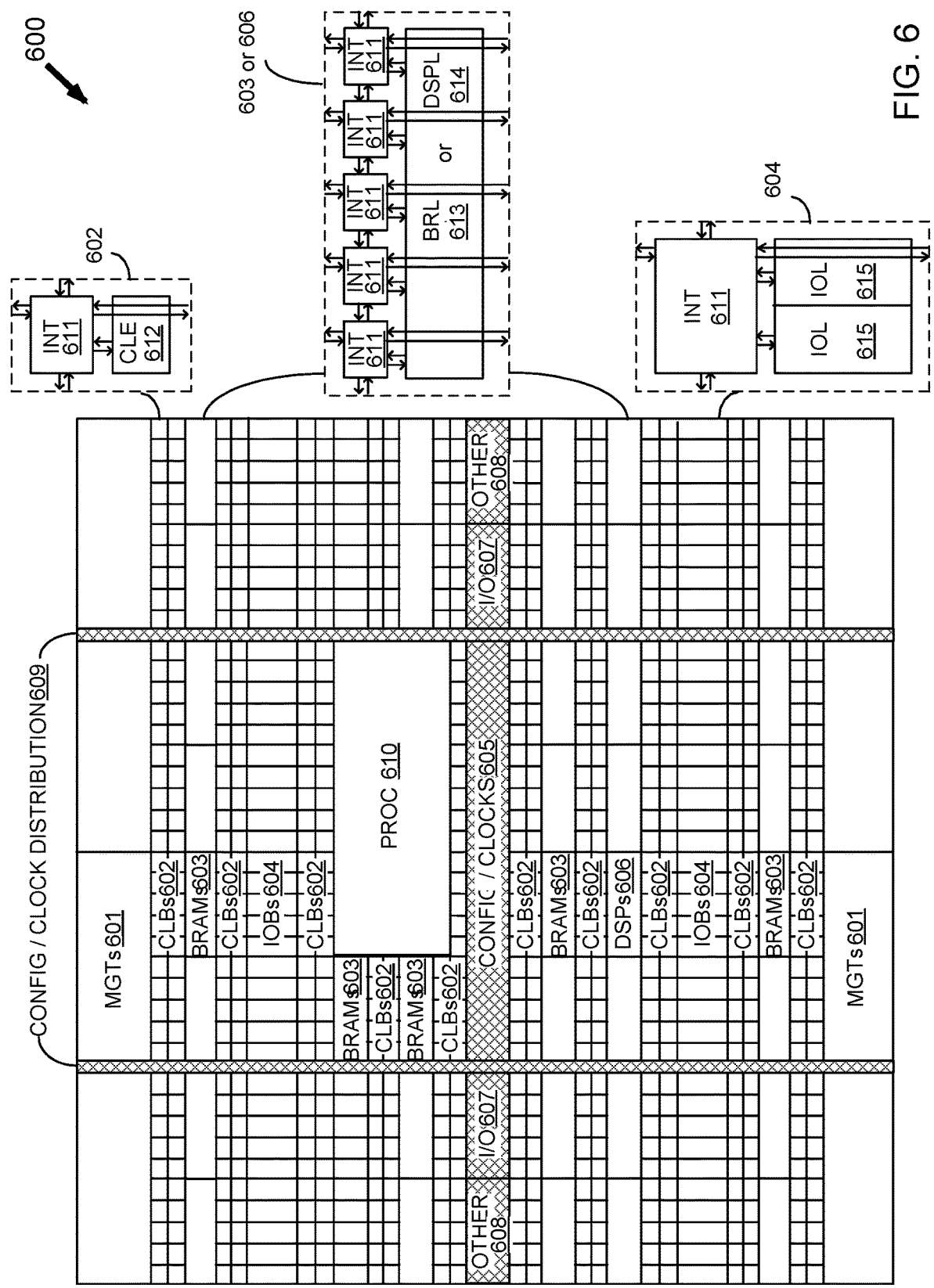
FIG. 6 is a simplified block diagram depicting an exemplary columnar Field Programmable Gate Array ("FPGA") architecture.

As noted above, advanced FPGAs can include several different types of programmable logic blocks in the array. For example, FIG. 6 illustrates an FPGA architecture 600 that includes a large number of different programmable tiles including multi-gigabit transceivers ("MGTs") 601, configurable logic blocks ("CLBs") 602, random access memory blocks ("BRAMs") 603, input/output blocks ("IOBs") 604, configuration and clocking logic ("CONFIG/CLOCKS") 605, digital signal processing blocks ("DSPs") 606, specialized input/output blocks ("I/O") 607 (e.g., configuration ports and clock ports), and other programmable logic 608 such as digital clock managers, analog-to-digital converters, system monitoring logic, and so forth. Some FPGAs also include dedicated processor blocks ("PROC") 610.

In some FPGAs, each programmable tile includes a programmable interconnect element ("INT") 611 having standardized connections to and from a corresponding interconnect element in each adjacent tile. Therefore, the programmable interconnect elements taken together implement the programmable interconnect structure for the illustrated FPGA. The programmable interconnect element 611 also includes the connections to and from the programmable logic element within the same tile, as shown by the examples included at the top of FIG. 6.

For example, a CLB 602 can include a configurable logic element ("CLE") 612 that can be programmed to implement user logic plus a single programmable interconnect element ("INT") 611. A BRAM 603 can include a BRAM logic element ("BRL") 613 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element ("DSPL") 614 in addition to an appropriate number of programmable interconnect elements. An IOB 604 can include, for example, two instances of an input/output logic element ("IOL") 615 in addition to one instance of the programmable interconnect element 611. As will be clear to those of skill in the art, the actual I/O pads connected, for example, to the I/O logic element 615 typically are not confined to the area of the input/output logic element 615.

In the pictured embodiment, a horizontal area near the center of the die (shown in FIG. 6) is used for configuration, clock, and other control logic. Vertical columns 609 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 610 spans several columns of CLBs and BRAMs.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A sort system for list decoding of a Polar codeword, comprising:
    a sorter circuit configured to receive and sort path metrics for coded bits of the Polar codeword, the path metrics obtained from log-likelihood ratios associated with the coded bits;
    a limiter circuit configured to cull the sorted path metrics to provide a list having a subset of the path metrics to limit output paths of a list decoder; and
    a normalizer circuit configured to subtract a path metric of the path metrics or a threshold metric representing a minimum metric respectively from entries in the list to provide normalized path metrics to decode the Polar codeword.

2. The sort system according to claim 1, wherein:
    the path metrics represent confidence values related to the coded bits each being a binary 1 or 0;
    the path metric or the threshold metric is greater than or equal to zero with the zero being a highest of the confidence values; and
    the subset is for the path metrics nearest or equal to zero.

3. The sort system according to claim 1, wherein the normalizer circuit includes subtractors configured to subtract the path metric or the threshold metric respectively from each entry in the list for Successive Cancellation List decoding of the Polar codeword.

4. The sort system according to claim 1, wherein the normalizer circuit includes subtractors and a comparator-multiplexer circuit configured to subtract the path metric respectively from each entry in the list for Successive Cancellation List decoding of the Polar codeword.

5. The sort system according to claim 1, wherein the normalizer circuit comprises:
   a comparator configured to receive the path metric and a zero value for comparison to provide a select signal;
   a demultiplexer configured responsive to the select signal to provide the list either to the subtractors or a bypass route to bypass the subtractors; and
   a multiplexer configured to output either the normalized path metrics or the list responsive to the select signal.

6. The sort system according to claim 1, wherein the normalizer circuit comprises:
   comparators each configured to respectively compare entries in the list of the path metrics with a saturation value to provide either a first logic state or a second logic state for each comparison to generate compare outputs;
   multiplexers corresponding to the comparators configured to receive the path metric and respectively receive the compare outputs for selection responsive to the compare outputs to respectively provide multiplexer outputs;
   subtractors having:
      a subtractor configured to subtract the path metric from the path metric to obtain zero; and
      a remainder of the subtractors corresponding to the multiplexers configured to respectively subtract either the path metric or the threshold metric from remaining entries in the list for Successive Cancellation List decoding of the Polar codeword.

7. The sort system according to claim 1, wherein the normalizer circuit comprises:
   comparators each configured to respectively compare entries in the list with a saturation value to provide either a first logic state or a second logic state for each comparison to generate compare outputs;
   multiplexers corresponding to the comparators configured to receive the path metric and respectively receive the compare outputs for selection respectively responsive to the compare outputs to respectively provide multiplexer outputs; and
   subtractors corresponding to the multiplexers configured to respectively subtract either the path metric or the threshold metric from a corresponding entry in the list for Successive Cancellation List decoding of the Polar codeword.

8. The sort system according to claim 1, wherein the normalizer circuit comprises:
   comparators each configured to respectively compare validity flag bit entries in the list with a compare bit to provide either a first logic state or a second logic state for each comparison to generate compare outputs;
   multiplexers corresponding to the comparators configured to receive the path metric and the threshold metric to respective data ports, and respectively receive the compare outputs as select signals for selection to respectively provide multiplexer outputs; and
   subtractors corresponding to the multiplexers configured to subtract either the path metric or the threshold metric from a corresponding entry in the list for Successive Cancellation List decoding of the Polar codeword.

9. A data processing kernel for list decoding of a Polar codeword, comprising:
   a datapath pipeline having a sort system and having upstream datapath functions and downstream datapath functions of a list decoder with respect to the sort system; and
   the sort system comprising:
      a sorter circuit configured to receive and sort path metrics for coded bits of the Polar codeword, the path metrics obtained from log-likelihood ratios associated with the coded bits;
      a limiter circuit configured to cull the sorted path metrics to provide a list having a subset of the path metrics to limit output paths of the list decoder; and
      a normalizer circuit configured to subtract a path metric of the path metrics or a threshold metric representing a minimum metric respectively from entries in the list to provide normalized path metrics to decode the Polar codeword.

10. The data processing kernel according to claim 9, wherein the upstream datapath functions and the downstream datapath functions include corresponding upstream log-likelihood-ratio processing circuits and downstream log-likelihood-ratio processing circuits.

11. The data processing kernel according to claim 10, wherein the datapath pipeline is configured for Successive Cancellation List decoding of the Polar codeword.

12. The data processing kernel according to claim 11, wherein the normalizer circuit configured to provide normalization of the list on a per set basis is configured to subtract a lowest path metric from the lowest path metric of the path metrics to return a zero value and to respectively subtract the lowest path metric from a remainder of the entries in the list.

13. A method for processing data for list decoding of a Polar codeword, comprising:
   obtaining path metrics by a sorter circuit for coded bits of the Polar codeword, the path metrics obtained from log-likelihood ratios associated with the coded bits;
   sorting by the sorter circuit the path metrics;
   culling by a limiter circuit the sorted path metrics to provide a list having a subset of the path metrics to limit output paths in a list decoder;
   normalizing by a normalizer circuit including subtracting a path metric of the path metrics or a threshold metric from entries in the list to provide normalized path metrics; and
   outputting differences from the subtracting as the normalized path metrics to decode the Polar codeword.

14. The method according to claim 13, wherein:
   the path metrics represent confidence values related to the coded bits each being a binary 1 or 0;
   the path metric or the threshold metric is greater than or equal to zero with the zero being a highest of the confidence values; and
   the subset is for the path metrics nearest or equal to zero.

15. The method according to claim 13, wherein the normalizing includes comparing a corresponding validity flag bit from each entry in the list to a compare bit.

16. The method according to claim 13, wherein the normalizing comprises:

comparing at least a subset of the entries in the list respectively to a saturation value to provide compare outputs; and respectively selecting responsive to the compare outputs either the path metric or the threshold metric for subtraction from a corresponding one of the path metrics of the list for Successive Cancellation List decoding of the Polar codeword.

17. The method according to claim 13, wherein the normalizing comprises:

comparing by a comparator the path metric or the threshold metric to provide a select signal;

demultiplexing by a demultiplexer responsive to the select signal to provide the list either to the normalizer circuit or a bypass route to bypass the normalizer circuit; and multiplexing by a multiplexer to output either the normalized path metrics or the list prior to the normalizing responsive to the select signal.

18. The method according to claim 13, wherein the path metrics are for Successive Cancellation List decoding of the Polar codeword.

19. The method according to claim 13, wherein the normalizing moves at least a portion of the subset of the path metrics away from a saturation value each by an amount associated with the differences corresponding thereto.

20. The method according to claim 13, wherein the normalizing moves at least a subset of the differences away from a saturation value for a next iteration of Successive Cancellation List decoding of the Polar codeword.

* * * * *